(12) United States Patent
Li et al.

(10) Patent No.: US 11,099,443 B2
(45) Date of Patent: Aug. 24, 2021

(54) DISPLAY PANEL AND DISPLAY APPARATUS HAVING A PLURALITY OF FIRST WIRINGS AND A PLURALITY OF SECOND WIRINGS

(71) Applicants: BOE TECHNOLOGY GROUP CO., LTD., Beijing (CN); Chongqing BOE Optoelectronics Technology Co., Ltd., Chongqing (CN)

(72) Inventors: Yunze Li, Beijing (CN); Ni Yang, Beijing (CN); Ming Deng, Beijing (CN); Zhiyong Li, Beijing (CN); Mengqiu Liu, Beijing (CN); Hui Li, Beijing (CN)

(73) Assignees: BOE TECHNOLOGY GROUP CO., LTD., Beijing (CN); Chongqing BOE Optoelectronics Technology Co., Ltd., Chongqing (CN)

(*) Notice: Subject to any disclaimer, the term of this patent is extended or adjusted under 35 U.S.C. 154(b) by 628 days.

(21) Appl. No.: 16/063,899

(22) PCT Filed: May 23, 2017

(86) PCT No.: PCT/CN2017/085498
§ 371 (c)(1),
(2) Date: Jun. 19, 2018

(87) PCT Pub. No.: WO2018/214024
PCT Pub. Date: Nov. 29, 2018

(65) Prior Publication Data
US 2021/0200013 A1 Jul. 1, 2021

(51) Int. Cl.
*G02F 1/1362* (2006.01)
*H01L 27/32* (2006.01)
*G02F 1/1368* (2006.01)

(52) U.S. Cl.
CPC ........ *G02F 1/13629* (2021.01); *G02F 1/1368* (2013.01); *H01L 27/3262* (2013.01); *H01L 27/3279* (2013.01)

(58) Field of Classification Search
CPC .. G02F 1/13629; G02F 1/1368; G02F 1/1345; G02F 1/13452; G02F 1/13156;
(Continued)

(56) References Cited

U.S. PATENT DOCUMENTS

2010/0283955 A1* 11/2010 Kim ............... G02F 1/1345
349/149
2013/0120344 A1 5/2013 Liao et al.
(Continued)

FOREIGN PATENT DOCUMENTS

CN 101950539 A 1/2011
CN 102402957 A 4/2012
(Continued)

OTHER PUBLICATIONS

International Search Report & Written Opinion dated Mar. 22, 2018, regarding PCT/CN2017/085498.

*Primary Examiner* — Joseph L Williams
*Assistant Examiner* — Jose M Diaz
(74) *Attorney, Agent, or Firm* — Intellectual Valley Law, P.C.

(57) ABSTRACT

The present application discloses a display panel having a plurality of wirings in the fan-out area respectively connected to a plurality of signal lines in the display area, each of the plurality of wirings in the fan-out area configured to transmit a signal to one of a plurality of subpixels through one of the plurality of signal lines in the display area; and a plurality of bonding pads respectively connected to the plurality of wirings, configured to bond the plurality of wirings with a driver integrated circuit. The plurality of (Continued)

wirings are grouped into a plurality of groups of wirings comprising a first group of a plurality of first wirings and a second group of a plurality of second wirings. The plurality of first wirings are made of a first conductive material. The plurality of second wirings are made of a second conductive material. The second conductive material has a resistivity greater than that of the first conductive material.

20 Claims, 7 Drawing Sheets

(58) Field of Classification Search
CPC ........... G02F 1/13458; G02F 1/136204; G02F 1/136295; H01L 27/3279; H01L 27/3262; H01L 27/3276; H01L 27/124; H01L 33/62; H01L 41/0477
See application file for complete search history.

(56) References Cited

U.S. PATENT DOCUMENTS

| | | |
|---|---|---|
| 2014/0291846 A1 | 10/2014 | Chai |
| 2016/0255719 A1 | 9/2016 | Song et al. |
| 2017/0192327 A1 | 7/2017 | Fu |
| 2017/0235199 A1 | 8/2017 | Wang et al. |

FOREIGN PATENT DOCUMENTS

| | | |
|---|---|---|
| CN | 103149753 A | 6/2013 |
| CN | 104134406 A | 11/2014 |
| CN | 104777690 A | 7/2015 |
| CN | 105388647 A | 3/2016 |

* cited by examiner

DISPLAY PANEL AND DISPLAY APPARATUS HAVING A PLURALITY OF FIRST WIRINGS AND A PLURALITY OF SECOND WIRINGS

CROSS-REFERENCE TO RELATED APPLICATION

This application is a national stage application under 35 U.S.C. § 371 of International Application No. PCT/CN2017/085498, filed May 23, 2017, the contents of which are incorporated by reference in the entirety.

TECHNICAL FIELD

The present invention relates to display technology, more particularly, to a display panel and a display apparatus having a plurality of first wirings and a plurality of second wirings.

BACKGROUND

Display panels includes a number of various types of signal lines, e.g., data lines, gate lines, and touch control lines. These signal lines provide voltage signals essential to the image display function of the display panels. For example, the data lines provide data signals to the subpixels in the display panels, and the gate lines provides gate scanning signals to each row of subpixels in the display panels.

SUMMARY

In one aspect, the present invention provides a display panel having a display area and a fan-out area, comprising a plurality of wirings in the fan-out area respectively connected to a plurality of signal lines in the display area, each of the plurality of wirings in the fan-out area configured to transmit a signal to one of the plurality of subpixels through one of the plurality of signal lines in the display area; and a plurality of bonding pads respectively connected to the plurality of wirings, configured to bond the plurality of wirings with a driver integrated circuit; wherein the plurality of wirings are grouped into a plurality of groups of wirings comprising a first group of a plurality of first wirings and a second group of a plurality of second wirings; each of the plurality of first wirings has a linear distance between its intersection with one of the plurality of signal lines and its intersection with one of the plurality of bonding pads in a first distance range; each of the plurality of second wirings has a linear distance between its intersection with one of the plurality of signal lines and its intersection with one of the plurality of bonding pads in a second distance range, the second distance range being less than the first distance range; the plurality of first wirings are made of a first conductive material; and the plurality of second wirings are made of a second conductive material; the second conductive material having a resistivity greater than that of the first conductive material.

Optionally, the display panel further comprises a plurality of thin film transistors respectively in the plurality of subpixels, each of the plurality of thin film transistors comprising a gate electrode, a source electrode and a drain electrode; wherein the display panel comprises a first conductive layer comprising the plurality of first wirings and a plurality of gate electrodes of the plurality of thin film transistors; a second conductive layer comprising the plurality of second wirings, a plurality of source electrodes and a plurality of drain electrodes of the plurality of thin film transistors; and a gate insulating layer between the first conductive layer and the second conductive layer.

Optionally, the display panel further comprises a plurality of thin film transistors respectively in the plurality of subpixels, each of the plurality of thin film transistors comprising a gate electrode, a source electrode and a drain electrode; wherein the display panel comprises a first conductive layer comprising the plurality of first wirings, a plurality of source electrodes and a plurality of drain electrodes of the plurality of thin film transistors; a second conductive layer comprising the plurality of second wirings and a plurality of gate electrodes of the plurality of thin film transistors; and a gate insulating layer between the first conductive layer and the second conductive layer.

Optionally, a maximum value among electrical resistances of the plurality of wirings is greater than a minimum value among electrical resistances of the plurality of wirings by no more than 10%.

Optionally, each of the plurality of wirings has a substantially the same electrical resistance.

Optionally, each of the plurality of first wirings has an electrical resistance substantially the same as that of each of the plurality of second wirings.

Optionally, each of the plurality of second wirings has a substantially the same total length.

Optionally, a portion of at least one of the plurality of second wirings has a zig-zag pattern.

Optionally, the linear distance between its intersection with one of the plurality of signal lines and its intersection with one of the plurality of bonding pads of a first one of the plurality of second wirings is less than that of a second one of the plurality of second wirings; and a first width of a first zig-zag pattern in the first one of the plurality of second wirings is greater than a second width of a second zig-zag pattern in the second one of the plurality of second wirings.

Optionally, the linear distance between its intersection with one of the plurality of signal lines and its intersection with one of the plurality of bonding pads of a first one of the plurality of second wirings is less than that of a second one of the plurality of second wirings; and a first length of a first zig-zag pattern in the first one of the plurality of second wirings is greater than a second length of a second zig-zag pattern in the second one of the plurality of second wirings.

Optionally, each of the plurality of first wirings has a substantially the same total length.

Optionally, a portion of at least one of the plurality of first wirings has a zig-zag pattern.

Optionally, the linear distance between its intersection with one of the plurality of signal lines and its intersection with one of the plurality of bonding pads of a first one of the plurality of first wirings is less than that of a second one of the plurality of first wirings; and a first width of a first zig-zag pattern in the first one of the plurality of first wirings is greater than a second width of a second zig-zag pattern in the second one of the plurality of first wirings.

Optionally, the linear distance between its intersection with one of the plurality of signal lines and its intersection with one of the plurality of bonding pads of a first one of the plurality of first wirings is less than that of a second one of the plurality of first wirings; and a first length of a first zig-zag pattern in the first one of the plurality of first wirings is greater than a second length of a second zig-zag pattern in the second one of the plurality of first wirings.

Optionally, the plurality of first wirings are on both sides of the plurality of second wirings in plan view of the display panel.

Optionally, the second distance range is non-overlapping with the first distance range.

Optionally, the linear distance between its intersection with one of the plurality of signal lines and its intersection with one of the plurality of bonding pads of each of the plurality of second wirings is less than that of each of the plurality of first wirings.

Optionally, the plurality of first wirings are made of copper and the plurality of second wirings are made of aluminum.

Optionally, the display panel further comprises a plurality of thin film transistors respectively in the plurality of subpixels, each of the plurality of thin film transistors comprising a gate electrode, a source electrode and a drain electrode; wherein the gate electrode is made of copper; and the source electrode and the drain electrode is made of aluminum.

In another aspect, the present invention provides a display apparatus comprising a display panel described herein.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
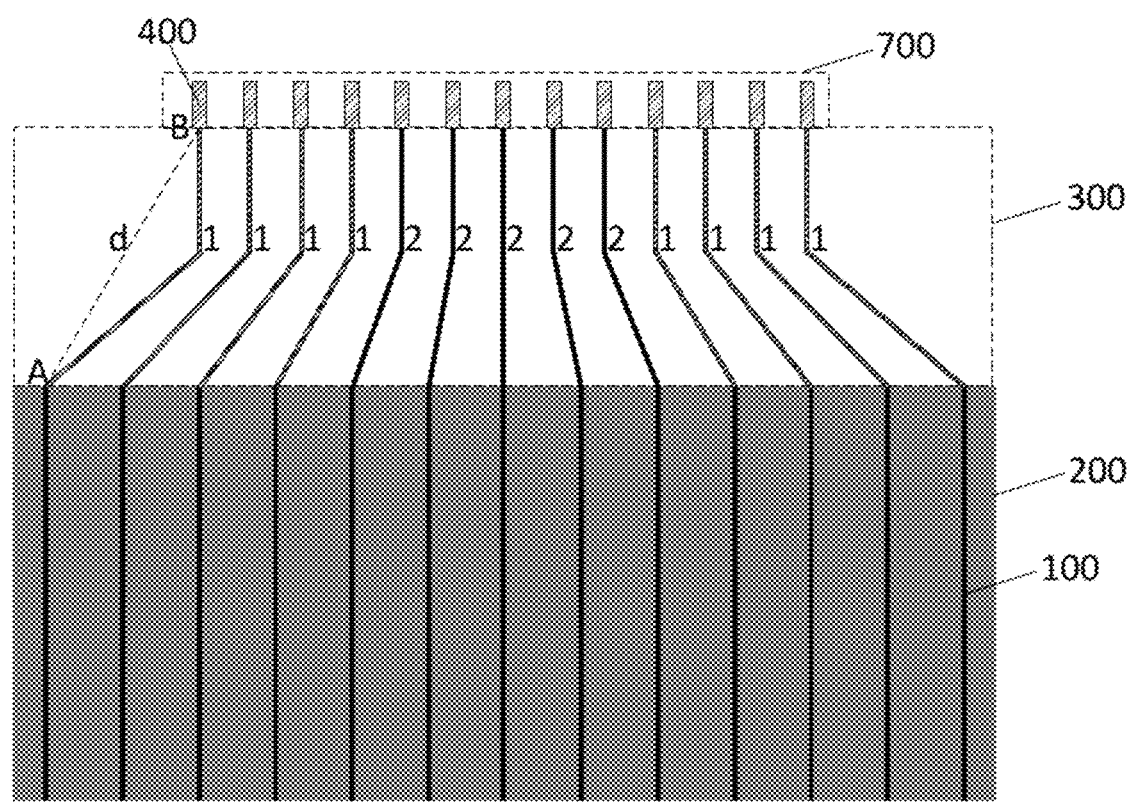
FIG. 1 is a schematic diagram of a display panel in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In conventional display apparatuses, the driver integrated circuits are disposed along the edge of the display apparatuses, and connected to signal lines in the display area through wirings in the fan-out area. The end portions of the wirings where they connect to the driver integrated circuit in the fan-out area are clustered in a small region of the display panel. The wirings extend out of the driver integrated circuit, and connect to signal lines which are arranged throughout the display apparatus. In a conventional configuration, the length of the wirings near the center of the fan-out area is shorter than the length of the wirings near the edges of the fan-out area. The length differences result in resistance differences among the wirings, which in turn result in RC delays of the signals transmitted to the display area, leading to display defects such as V-block and stain.

Accordingly, the present disclosure provides, inter alia, a display panel and a display apparatus having a plurality of first wirings and a plurality of second wirings that substantially obviate one or more of the problems due to limitations and disadvantages of the related art. In one aspect, the present disclosure provides a display panel having a display area and a fan-out area. In some embodiments, the display panel includes a plurality of wirings in the fan-out area respectively connected to the plurality of signal lines in the display area, each of the plurality of wirings in the fan-out area configured to transmit a signal to one of the plurality of subpixels through one of the plurality of signal lines in the display area; and a plurality of bonding pads respectively connected to the plurality of wirings, configured to bond the plurality of wirings with a driver integrated circuit. Optionally, each of the plurality of wirings has a linear distance between a first intersection with one of the plurality of signal lines and a second intersection with one of the plurality of bonding pads, the plurality of wirings are grouped into a plurality of groups of wirings including a first group of a plurality of first wirings and a second group of a plurality of second wirings. Optionally, each of the plurality of first wirings has a linear distance between a first intersection with one of the plurality of signal lines and a second intersection with one of the plurality of bonding pads in a first distance range, each of the plurality of second wirings has a linear distance between a first intersection with one of the plurality of signal lines and a second intersection with one of the plurality of bonding pads in a second distance range, the second distance range being less than the first distance range. Optionally, the plurality of first wirings are made of a first conductive material; and the plurality of second wirings are made of a second conductive material; the second conductive material having a resistivity greater than that of the first conductive material.

As used herein, the term "display area" refers to an area of a display panel where image is actually displayed.

As used herein, the term "fan-out area" refers to an area of a display panel where plurality of wirings for connecting terminals of a plurality of signal lines and a plurality of bonding pads are located. The fan-out area is outside the display area.

As used herein, the term "linear distance" in the context of the present disclosure refers to, for each of the plurality of wirings, a linear distance between its first intersection with one of the plurality of signal lines and its second intersection with one of the plurality of bonding pads.

FIG. 1 is a schematic diagram of a display panel in some embodiments according to the present disclosure. Referring to FIG. 1, the display panel in some embodiments has a plurality of signal lines 100 in a display area 200. The plurality of signal lines 100 extend through the display area 200, and are configured to provide a plurality of signals to a plurality of subpixels in the display area 200. The display panel also has a fan-out area 300 adjacent to the display area 200. The display panel includes a plurality of wirings (e.g., a plurality of first wirings 1 and a plurality of second wirings 2 in FIG. 1) in the fan-out area 300. Each of the plurality of wirings is connected to one of the plurality of signal lines 100 (e.g., in a one-to-one corresponding relationship). Each of the plurality of wirings is configured to transmit a signal to a corresponding one of the plurality of subpixels through a corresponding one of the plurality of signal lines. Optionally, the plurality of signal lines 100 are a plurality of data lines configured to respectively provide a plurality of data signals to the plurality of subpixels. Optionally, the plurality of signal lines 100 are a plurality of gate lines configured to respectively provide a plurality of gate scanning signals to the plurality of subpixels.

In some embodiments, the display panel further includes a plurality of bonding pads 400 in a bonding pads area 700. The plurality of bonding pads are respectively connected to the plurality of wirings, and are configured to bond the plurality of wirings with a driver integrated circuit. Optionally, the plurality of signal lines 100 are a plurality of data lines, and the plurality of bonding pads 400 are configured to bond the plurality of wirings with a data driver integrated circuit. Optionally, the plurality of signal lines 100 are a plurality of gate lines, and the plurality of bonding pads 400 are configured to bond the plurality of wirings with a gate driver integrated circuit.

The plurality of wirings connect the plurality of signal lines 100 throughout the display panel to the plurality of bonding pads 400, which typically are disposed in a small area in a peripheral region of the display panel. Thus, distances between pairs of a terminal of a signal line and a terminal of a corresponding bonding pad vary depending on the position of the signal line. For signal lines distal to the bonding pads, the distance is larger. For signal lines proximal to the bonding pads, the distance is smaller. Each of the plurality of wirings has a linear distance between a first intersection with one of the plurality of signal lines 100 and a second intersection with one of the plurality of bonding pads 400. Referring to FIG. 1, the leftist signal line is shown to have a first intersection A with a corresponding signal line, and a second intersection B with a corresponding bonding pad. The linear distance between the first intersection A and the second intersection B is denoted as "d" in FIG. 1.

In some embodiments, the plurality of wirings are grouped into a plurality of groups of wirings, e.g., 2, 3, 4, 5, or more groups of wirings. Each group of wirings is made of a different conductive material, e.g., a different metal or alloy material. Each wiring has a linear distance between its intersection with the corresponding signal line and its intersection with the corresponding bonding pad. The linear distance in each group of wirings is in a different distance range. Resistivity of the conductive materials for the plurality of groups of wirings are ranked according to the distance ranges. As shown in FIG. 1, the plurality of wirings in some embodiments are grouped into a first group of a plurality of first wirings 1 and a second group of a plurality of second wirings 2. The linear distance between the first intersection with the corresponding signal line and the second intersection with the corresponding bonding pad of each of the plurality of first wirings 1 is in a first distance range. The linear distance between the first intersection with the corresponding signal line and the second intersection with the corresponding bonding pad of each of the plurality of second wirings 2 is in a second distance range. The second distance range is less than the first distance range. Optionally, the second distance range is non-overlapping with the first distance range. Optionally, the linear distance between the first intersection with the corresponding signal line and the second intersection with the corresponding bonding pad of each of the plurality of second wirings 2 is less than that of each of the plurality of first wirings 1. Optionally, the plurality of first wirings 1 are on both sides of the plurality of second wirings 2 in plan view of the display panel. The plurality of first wirings 1 are made of a first conductive material. e.g., a first metal or alloy material. The plurality of second wirings 2 are made of a second conductive material, e.g., a second metal or alloy material. The second conductive material has a resistivity greater than that of the first conductive material.

In the present display panel, by making the wirings having a smaller linear distance between the first intersection with the corresponding signal line and the second intersection with the corresponding bonding pad using a conductive material having higher resistivity and making the wirings having a larger linear distance between the first intersection with the corresponding signal line and the second intersection with the corresponding bonding pad using a conductive material having lower resistivity, the plurality of wirings may be made to have a substantially the same electrical resistance, thereby obviating the RC delay issue in the display panel due to the resistance differences of the plurality of wirings. In some embodiments, a maximum value among electrical resistances of the plurality of wirings is greater than a minimum value among electrical resistances of the plurality of wirings by no more than 10%, e.g., no more than 7.5%, no more than 5%, no more than 2.5%, and no more than 1%. Optionally, each of the plurality of wirings has a substantially the same electrical resistance. Optionally, each of the plurality of first wirings 1 has an electrical resistance substantially the same as that of each of the plurality of second wirings 2.

Electrical resistance of a wiring depends on resistivity of the conductive material, the length of the wiring, and the cross-sectional area of the wiring. Accordingly, in some embodiments, each of the plurality of wirings may be made to have a certain thickness, a total length, and a resistivity to further reduce the variations of resistivity among the plurality of wirings.

For example, in some embodiments, the plurality of first wirings 1 may be made to have a thickness larger than that of the plurality of second wirings 2. Optionally, each of the plurality of first wirings 1 has a substantially the same thickness, e.g., a first thickness. Optionally, each of the plurality of second wirings 2 has a substantially the same thickness, e.g., a second thickness. Optionally, the first thickness is larger than the second thickness.

Optionally, each of the plurality of wirings has a substantially the same thickness.

Optionally, each of the plurality of wirings has a substantially the same total length.

In some embodiments, the plurality of first wirings 1 may be made to have a total length different than that of the plurality of second wirings 2. Optionally, the total lengths of the plurality of first wiring 1 are in a first length range. Optionally, the total lengths of the plurality of second wirings 2 are in a second length range. Optionally, the first length range substantially overlaps with the second length range. Optionally, the first length range is less than the second length range. Optionally, each of the plurality of first wirings has a substantially the same total length. e.g., a first length. Optionally, each of the plurality of second wirings has a substantially the same total length, e.g., a second length. Optionally, the first length is substantially the same as the second length. Optionally, the first length is less than the second length.

Figure 2:
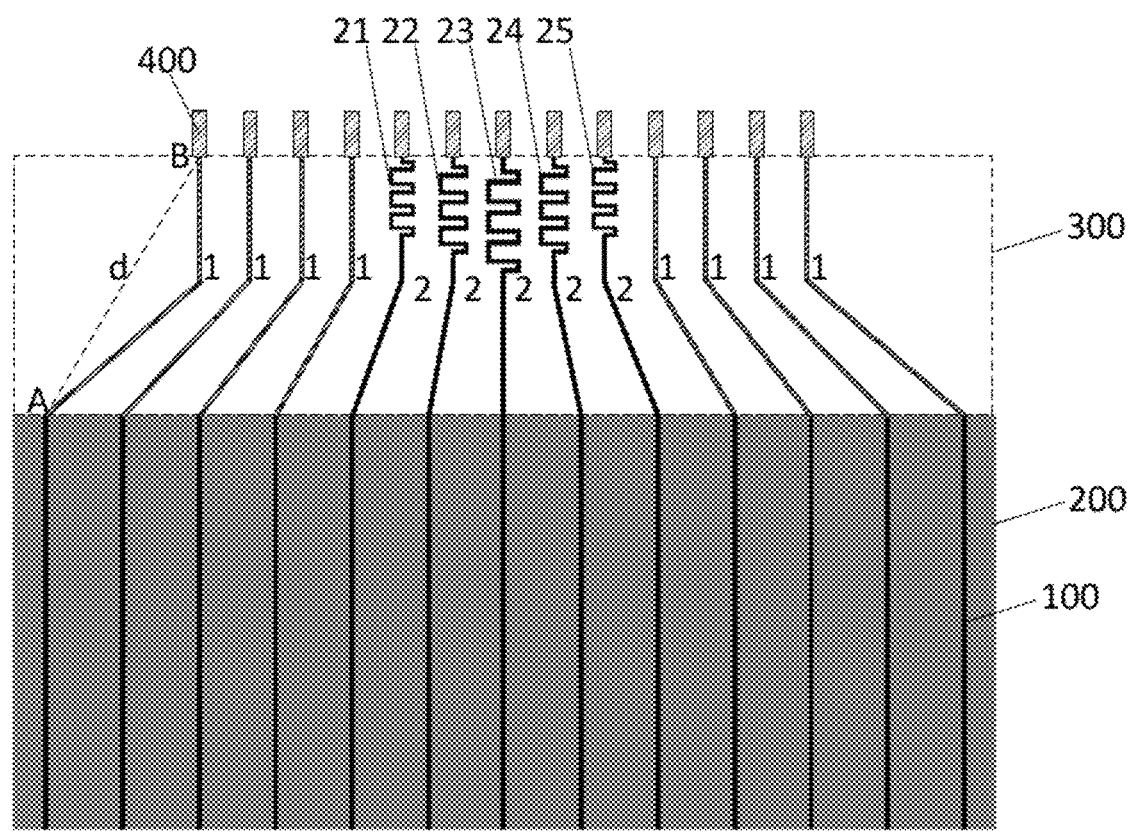
FIG. 2 is a schematic diagram of a display panel in some embodiments according to the present disclosure.

Because the linear distances (respectively between the first intersection with a corresponding signal line and the second intersection with a corresponding bonding pad) of the plurality of second wirings 2 are smaller, to increase the total length of one or more of the plurality of second wirings 2, one or more of the plurality of second wirings 2 may be designed to have a zig-zag pattern in at least a portion of the wiring. FIG. 2 is a schematic diagram of a display panel in some embodiments according to the present disclosure.

Referring to FIG. 2, each of the plurality of second wirings 2 in some embodiments includes a portion having a zig-zag pattern, e.g., the zig-zag patterns 21, 22, 23, 24, and 25 as shown in FIG. 2.

Figure 3:
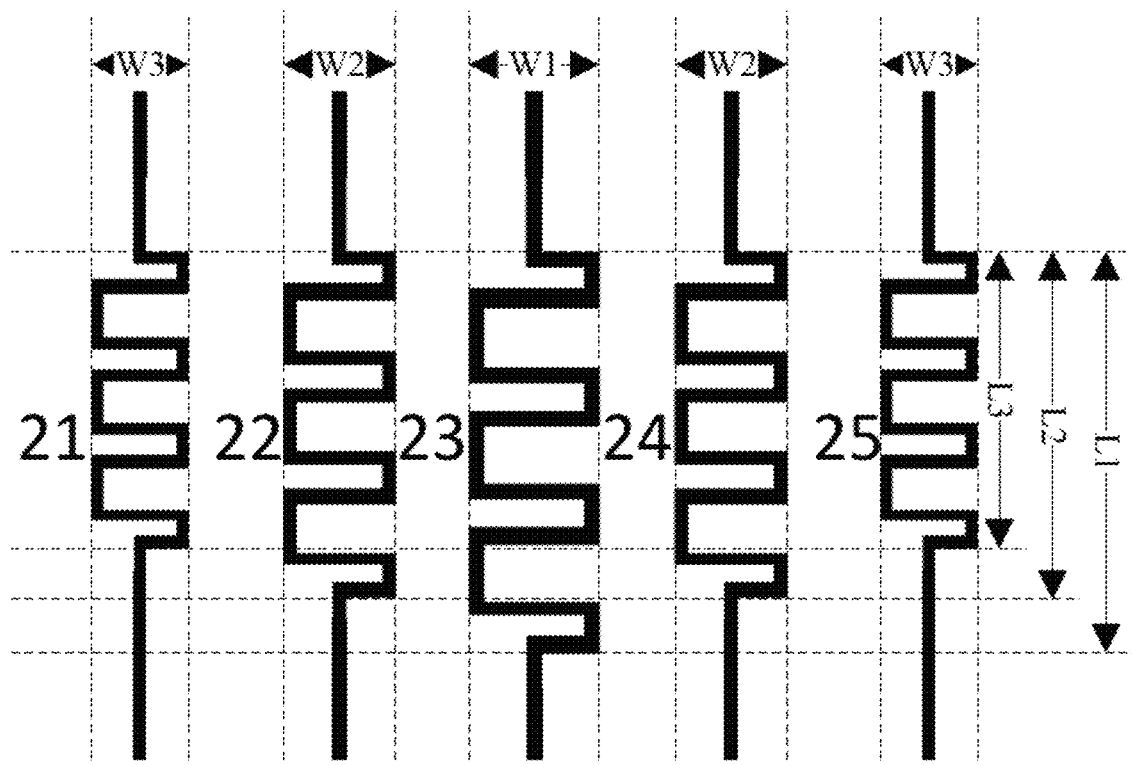
FIG. 3 is a schematic diagram of zig-zag patterns of wirings in a display panel in some embodiments according to the present disclosure.

In some embodiments, the linear distance (between an intersection with a signal line and an intersection with a bonding pad) of a first one of the plurality of second wirings 2 is less than that of a second one of the plurality of second wirings 2, and a first width of a first zig-zag pattern in the first one of the plurality of second wirings 2 is greater than a second width of a second zig-zag pattern in the second one of the plurality of second wirings 2. FIG. 3 is a schematic diagram of zig-zag patterns of wirings in a display panel in some embodiments according to the present disclosure. Referring to FIG. 3, five zig-zag patterns 21, 22, 23, 24, and 25 corresponding to five different second wirings are shown. The zig-zag pattern 23 is in a portion of a second wirings having the smallest linear distance (among the five second wirings in FIG. 3) between its intersection with a corresponding signal line and its intersection with a corresponding bonding pad. The zig-zag patterns 22 and 24 are respectively in portions of two second wirings having the medium linear distances between respective intersection with a corresponding signal line and respective intersection with a corresponding bonding pad. The zig-zag patterns 21 and 25 are respectively in portions of two second wirings having the largest linear distances (among the five second wirings in FIG. 3) between respective intersection with a corresponding signal line and respective intersection with a corresponding bonding pad. As shown in FIG. 3, the zig-zag pattern 23 has a width w1, the zig-zag patterns 22 and 24 have a width w2, and the zig-zag patterns 21 and 25 have a width w3. The width w1 is larger than the width w2, which in turn is larger than the width w3.

In some embodiments, the linear distance (between an intersection with a signal line and an intersection with a bonding pad) of a first one of the plurality of second wirings 2 is less than that of a second one of the plurality of second wirings 2, and a first length of a first zig-zag pattern in the first one of the plurality of second wirings 2 is greater than a second length of a second zig-zag pattern in the second one of the plurality of second wirings 2. As shown in FIG. 3, the zig-zag pattern 23 has a length L1, the zig-zag patterns 22 and 24 have a length L2, and the zig-zag patterns 21 and 25 have a length L3. The length L1 is larger than the length L2, which in turn is larger than the length L.

The width and length of each of the zig-zag patterns of the plurality of second wirings 2 may be designed such that the electrical resistances of the plurality of second wirings 2 are substantially the same. Optionally, the width and length of each of the zig-zag patterns of the plurality of second wirings 2 may be designed such that the electrical resistance of each of the plurality of second wirings 2 is substantially the same as that of each of the plurality of first wirings 1. Optionally, one or more of the plurality of second wirings 2 does not have a zig-zag pattern. Optionally, when the thickness of each of the second wirings 2 are substantially the same, the width and length of each of the zig-zag patterns of the plurality of second wirings 2 may be designed such that the total lengths of the plurality of second wirings 2 are substantially the same.

Figure 4:
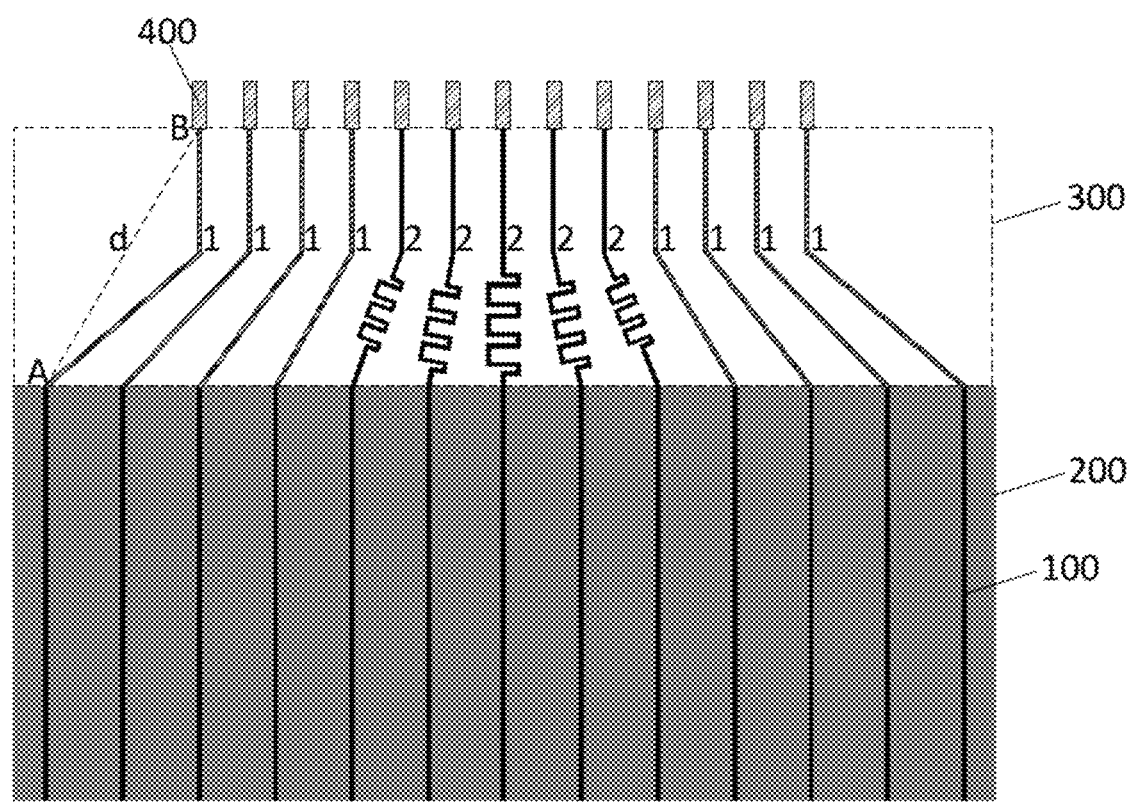
FIG. 4 is a schematic diagram of a display panel in some embodiments according to the present disclosure.

The zig-zag pattern may be disposed at any portion of the second wiring. In FIG. 2, the zig-zag patterns are in a portion of each of the plurality of second wirings 2 substantially along a direction substantially parallel to the plurality of signal lines 100. FIG. 4 is a schematic diagram of a display panel in some embodiments according to the present disclosure. In FIG. 4, the zig-zag patterns are in a portion of each of the plurality of second wirings 2 along a direction not parallel to the plurality of signal lines 100. e.g., at an angle with the plurality of signal lines 100.

Figure 5:
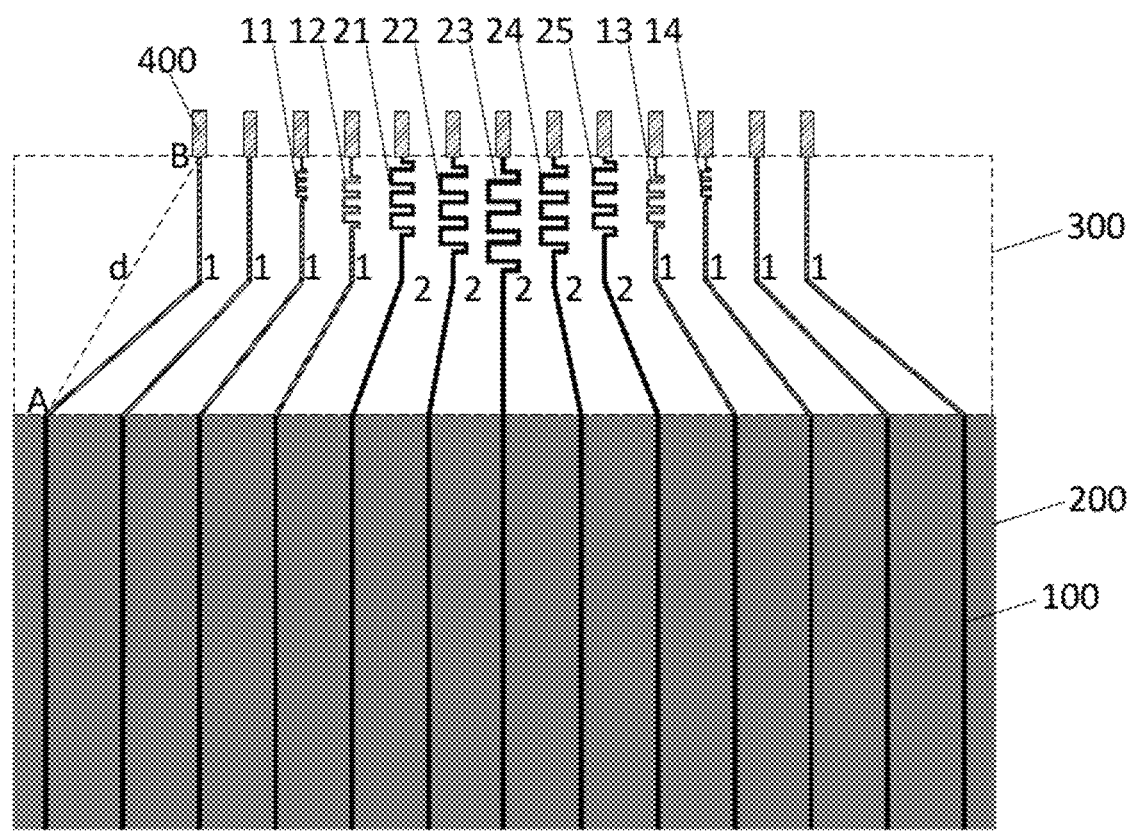
FIG. 5 is a schematic diagram of a display panel in some embodiments according to the present disclosure.

In some embodiments, one or more of the plurality of first wirings 1 may also include a portion having a zig-zag pattern. FIG. 5 is a schematic diagram of a display panel in some embodiments according to the present disclosure. Referring to FIG. 5, four zig-zag patterns 11, 12, 13, and 14 corresponding to four different first wirings are shown. The zig-zag patterns 12 and 13 are respectively in portions of two first wirings having relatively smaller linear distances between respective intersection with a corresponding signal line and respective intersection with a corresponding bonding pad. The zig-zag patterns 11 and 14 are respectively in portions of two first wirings having relatively larger linear distances between respective intersection with a corresponding signal line and respective intersection with a corresponding bonding pad. The zig-zag pattern 11 and 14 have a width smaller than that of the zig-zag patterns 12 and 13, and have a length smaller than that of the zig-zag patterns 12 and 13. As shown in FIG. 5, in some embodiments, some of the plurality of first wirings 1 do not include a portion having a zig-zag pattern.

The width and length of each of the zig-zag patterns of the plurality of first wirings 1 may be designed such that the electrical resistances of the plurality of first wirings 1 are substantially the same. Optionally, the width and length of each of the zig-zag patterns of the plurality of first wirings 1 may be designed such that the electrical resistance of each of the plurality of first wirings 1 is substantially the same as that of each of the plurality of second wirings 2. Optionally, one or more of the plurality of first wirings 1 does not have a zig-zag pattern. Optionally, when the thickness of each of the first wirings 1 are substantially the same, the width and length of each of the zig-zag patterns of the plurality of first wirings 1 may be designed such that the total lengths of the plurality of first wirings 1 are substantially the same.

Optionally, each of the zig-zag pattern in the plurality of first wirings 1 has a width smaller than that of each of the zig-zag pattern in the plurality of second wirings 2. Optionally, each of the zig-zag pattern in the plurality of first wirings 1 has a length smaller than that of each of the zig-zag pattern in the plurality of second wirings 2.

In some embodiments, and as shown in FIGS. 1-2, and 4-5, the plurality of wirings are distributed in a symmetric or pseudo-symmetric arrangement. Optionally, the plurality of first wirings 1 are on both sides of the plurality of second wirings 2 in plan view of the display panel. Optionally, the plurality of second wirings 2 are in the center or proximal to the center of an area having the plurality of wirings, and the plurality of first wirings 1 are distal to the center of the area having the plurality of wirings.

Figure 6:
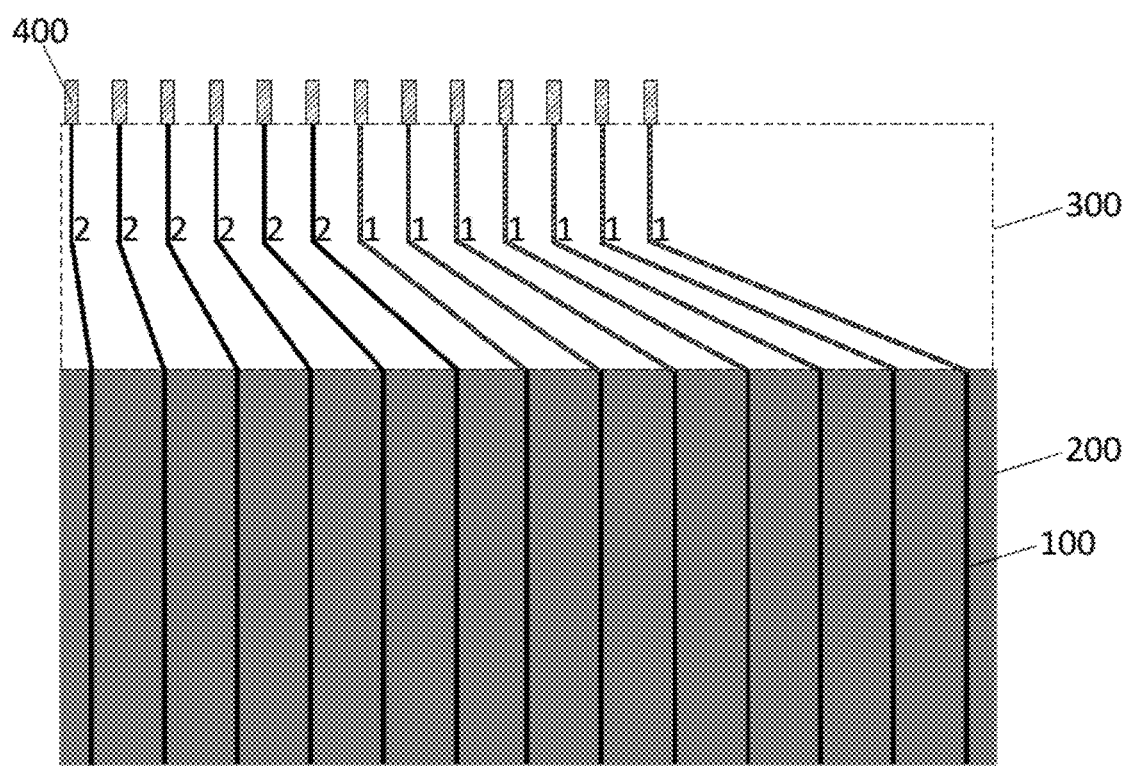
FIG. 6 is a schematic diagram of a display panel in some embodiments according to the present disclosure.

In some embodiments, the plurality of wirings are distributed in an asymmetric arrangement. FIG. 6 is a schematic diagram of a display panel in some embodiments according to the present disclosure. Referring to FIG. 6, the plurality of first wirings 1 are on a first side of the display panel and the plurality of second wirings 2 are on a second side of the display panel different from the first side. Each of the plurality of first wirings 1 has a linear distance between its intersection with a corresponding signal line and its intersection with a corresponding bonding pad greater than that of each of the plurality of second wirings 2. The plurality of first wirings are made of a first conductive material, the plurality of second wirings are made of a second conductive material, and the second conductive material has a resistivity greater than that of the first conductive material.

Figure 7:
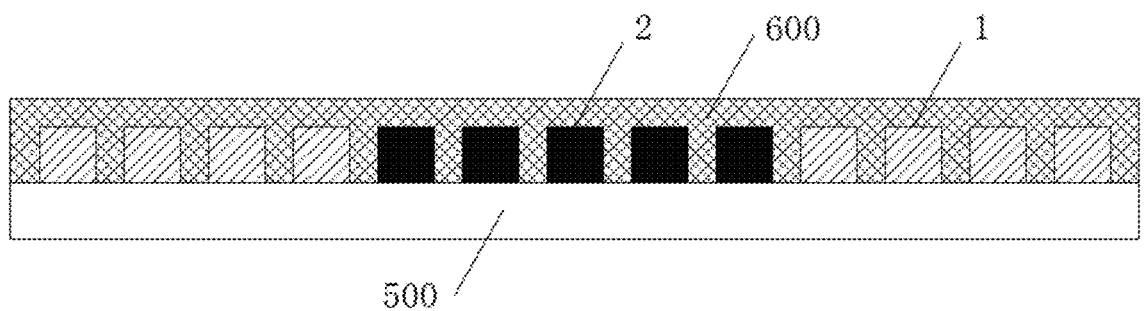
FIG. 7 is a cross-sectional view of a plurality of wirings in a display panel in some embodiments according to the present disclosure.

In some embodiments, the plurality of wirings are on a substantially the same horizontal plane. FIG. 7 is a cross-sectional view of a plurality of wirings in a display panel in some embodiments according to the present disclosure. Referring to FIG. 7, the display panel in some embodiments includes a first conductive layer having the plurality of first wirings 1 and a second conductive layer having the plurality of second wirings 2 on a base substrate 500. The first conductive layer and the second conductive layer are on a substantially the same horizontal plane. Optionally, the first conductive layer is in a same layer as the gate electrode of the thin film transistors of the display panel.

Figure 8:
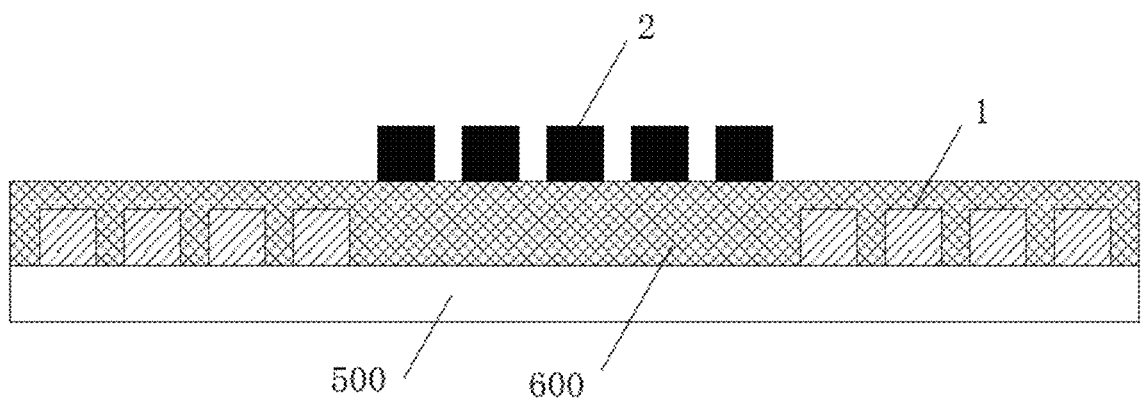
FIG. 8 is a cross-sectional view of a plurality of wirings in a display panel in some embodiments according to the present disclosure.

In some embodiments, the display panel includes a plurality of thin film transistors (e.g., a plurality of switching thin film transistors) respectively in the plurality of subpixels, each of the plurality of thin film transistors including a gate electrode, a source electrode and a drain electrode. The display panel includes a first conductive layer having a plurality of first wirings and a second conductive layer having a plurality of second wirings, the first conductive layer and the second conductive layer being in different layers. FIG. 8 is a cross-sectional view of a plurality of wirings in a display panel in some embodiments according to the present disclosure. Referring to FIG. 8, the display panel includes a first conductive layer on a base substrate 500, a gate insulating layer 600 on a side of the first conductive layer distal to the base substrate 500, and a second conductive layer on a side of the gate insulating layer 600 distal to the base substrate 500. The first conductive layer includes a plurality of first wirings 1. The second conductive layer includes a plurality of second wirings 2. Optionally, the first conductive layer further includes a plurality of gate electrodes of the plurality of thin film transistors, e.g., the plurality of first wirings 1 and the plurality of gate electrodes of the plurality of thin film transistors are in a same layer, made of a same material, and patterned in a same patterning process. Optionally, the second conductive layer further includes a plurality of source electrodes and a plurality of drain electrodes of the plurality of thin film transistors, e.g., the plurality of second wirings 2, the plurality of source electrodes and the plurality of drain electrodes of the plurality of thin film transistors are in a same layer, made of a same material, and patterned in a same patterning process. The gate insulating layer 600 is between the first conductive layer and the second conductive layer.

Figure 9:
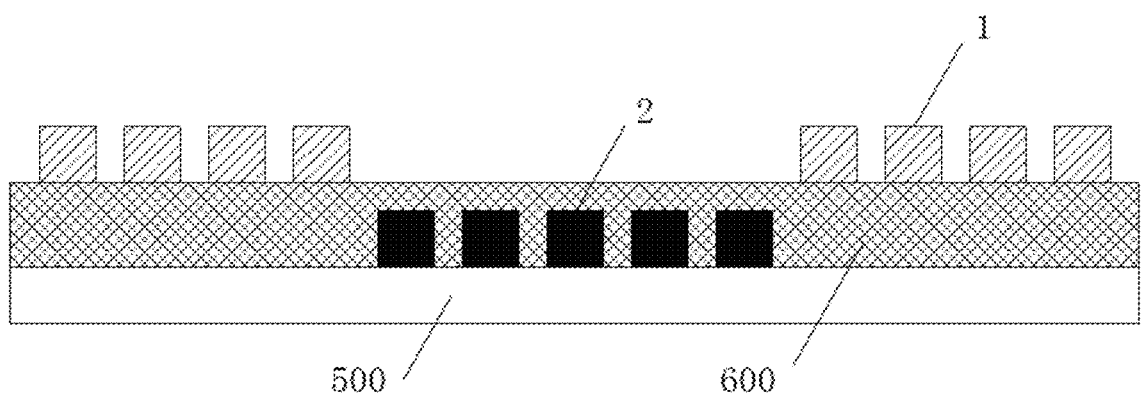
FIG. 9 is a cross-sectional view of a plurality of wirings in a display panel in some embodiments according to the present disclosure.

FIG. 9 is a cross-sectional view of a plurality of wirings in a display panel in some embodiments according to the present disclosure. Referring to FIG. 9, the display panel includes a second conductive layer on a base substrate 500, a gate insulating layer 600 on a side of the second conductive layer distal to the base substrate 500, and a first conductive layer on a side of the gate insulating layer 600 distal to the base substrate 500. The first conductive layer includes a plurality of first wirings 1. The second conductive layer includes a plurality of second wirings 2. Optionally, the second conductive layer further includes a plurality of gate electrodes of the plurality of thin film transistors, e.g., the plurality of second wirings 2 and the plurality of gate electrodes of the plurality of thin film transistors are in a same layer, made of a same material, and patterned in a same patterning process. Optionally, the first conductive layer further includes a plurality of source electrodes and a plurality of drain electrodes of the plurality of thin film transistors, e.g., the plurality of first wirings 1, the plurality of source electrodes and the plurality of drain electrodes of the plurality of thin film transistors are in a same layer, made of a same material, and patterned in a same patterning process. The gate insulating layer 600 is between the first conductive layer and the second conductive layer.

Various appropriate conductive materials and various appropriate fabricating methods may be used to make the plurality of first wirings and the plurality of second wirings. For example, a conductive material may be deposited on the substrate by a plasma-enhanced chemical vapor deposition (PECVD) process. Examples of appropriate conductive materials include, but are not limited to, copper, aluminum, molybdenum, silver, chromium, tungsten, titanium, tantalum, and alloys or laminates containing the same.

In some embodiments, the plurality of first wirings are made of a same conductive material as that of the plurality of gate electrodes of the plurality of thin film transistors in the display area of the display panel. In some embodiments, the plurality of second wirings are made of a same conductive material as that of the plurality of source electrodes and the plurality of drain electrodes of the plurality of thin film transistors in the display area of the display panel. Optionally, the plurality of first wirings are made of copper and the plurality of second wirings are made of aluminum. Optionally, the plurality of first wirings and the plurality of gate electrodes of the plurality of thin film transistors in the display area of the display panel are made of copper, and the plurality of second wirings, the plurality of source electrodes and the plurality of drain electrodes of the plurality of thin film transistors in the display area of the display panel are made of aluminum.

In some embodiments, the display panel is a liquid crystal display panel.

In some embodiments, the display panel is an organic light emitting diode display panel.

In another aspect, the present disclosure provides a method of fabricating a display panel having a plurality of subpixels in a display area. In some embodiments, the method includes forming a plurality of signal lines in the display area; forming a plurality of wirings respectively connected to the plurality of signal lines in the display area; and forming a plurality of bonding pads respectively connected to the plurality of wirings. Each of the plurality of wirings is formed to have a linear distance between a first intersection with one of the plurality of signal lines and a second intersection with one of the plurality of bonding pads. Optionally, the step of forming the plurality of wirings includes forming a plurality of groups of wirings. Optionally, the step of forming the plurality of groups of wirings includes forming a first group of a plurality of first wirings and forming a second group of a plurality of second wirings. The plurality of first wirings are formed so that the linear distance of each of the plurality of first wirings is in a first distance range. The plurality of second wirings are formed so that the linear distance of each of the plurality of second wirings is in a second distance range, the second distance range being less than the first distance range. The plurality of first wirings are formed using a first conductive material, the plurality of second wirings are formed using a second conductive material; the second conductive material having a resistivity greater than that of the first conductive material.

In some embodiments, the method further includes forming a plurality of thin film transistors (e.g., a plurality of switching thin film transistors) respectively in the plurality of subpixels, each of the plurality of thin film transistors having a gate electrode, a source electrode and a drain electrode. Optionally, the method includes forming a first conductive layer including the plurality of first wirings and a plurality of gate electrodes of the plurality of thin film transistors on a base substrate; forming a gate insulating layer on a side of the first conductive layer distal to the base substrate, and forming a second conductive layer including the plurality of second wirings, a plurality of source electrodes and a plurality of drain electrodes of the plurality of thin film transistors, on a side of the gate insulating layer distal to the base substrate. Optionally, the plurality of first wirings and a plurality of gate electrodes of the plurality of thin film transistors are formed using a same conductive material, and patterned in a same patterning process using a same mask plate. Optionally, the plurality of second wirings, a plurality of source electrodes and a plurality of drain electrodes of the plurality of thin film transistors are formed using a same conductive material, and patterned in a same patterning process using a same mask plate.

Optionally, the method includes forming a second conductive layer including the plurality of second wirings, a plurality of source electrodes and a plurality of drain electrodes of the plurality of thin film transistors on a base substrate; forming a gate insulating layer on a side of the second conductive layer distal to the base substrate, and forming a first conductive layer including the plurality of first wirings and a plurality of gate electrodes of the plurality of thin film transistors, on a side of the gate insulating layer distal to the base substrate. Optionally, the plurality of second wirings, a plurality of source electrodes and a plurality of drain electrodes of the plurality of thin film transistors are formed using a same conductive material, and patterned in a same patterning process using a same mask plate. Optionally, the plurality of first wirings and a plurality of gate electrodes of the plurality of thin film transistors are formed using a same conductive material, and patterned in a same patterning process using a same mask plate.

Optionally, the method includes forming a second conductive layer including the plurality of second wirings and a plurality of gate electrodes of the plurality of thin film transistors on a base substrate; forming a gate insulating layer on a side of the second conductive layer distal to the base substrate, and forming a first conductive layer including the plurality of first wirings, a plurality of source electrodes and a plurality of drain electrodes of the plurality of thin film transistors, on a side of the gate insulating layer distal to the base substrate. Optionally, the plurality of second wirings and a plurality of gate electrodes of the plurality of thin film transistors are formed using a same conductive material, and patterned in a same patterning process using a same mask plate. Optionally, the plurality of first wirings, a plurality of source electrodes and a plurality of drain electrodes of the plurality of thin film transistors are formed using a same conductive material, and patterned in a same patterning process using a same mask plate.

Optionally, the method includes forming a first conductive layer including the plurality of first wirings, a plurality of source electrodes and a plurality of drain electrodes of the plurality of thin film transistors on a base substrate; forming a gate insulating layer on a side of the first conductive layer distal to the base substrate, and forming a second conductive layer including the plurality of second wirings and a plurality of gate electrodes of the plurality of thin film transistors, on a side of the gate insulating layer distal to the base substrate. Optionally, the plurality of first wirings, a plurality of source electrodes and a plurality of drain electrodes of the plurality of thin film transistors are formed using a same conductive material, and patterned in a same patterning process using a same mask plate. Optionally, the plurality of second wirings and a plurality of gate electrodes of the plurality of thin film transistors are formed using a same conductive material, and patterned in a same patterning process using a same mask plate.

Optionally, each of the plurality of second wirings is formed to have a substantially the same total length.

Optionally, the step of forming the plurality of second wirings includes forming a portion of at least one of the plurality of second wirings in a zig-zag pattern. Optionally, the step of forming the plurality of second wirings includes forming a first one of the plurality of second wirings and a second one of the plurality of second wirings so that the linear distance (between its intersection with a corresponding signal line and its intersection with a corresponding bonding pad) of the first one of the plurality of second wirings is less than that of the second one of the plurality of second wirings, and a first width of a first zig-zag pattern in the first one of the plurality of second wirings is greater than a second width of a second zig-zag pattern in the second one of the plurality of second wirings. Optionally, the step of forming the plurality of second wirings includes forming a first one of the plurality of second wirings and a second one of the plurality of second wirings so that the linear distance (between its intersection with a corresponding signal line and its intersection with a corresponding bonding pad) of the first one of the plurality of second wirings is less than that of the second one of the plurality of second wirings, and a first length of a first zig-zag pattern in the first one of the plurality of second wirings is greater than a second length of a second zig-zag pattern in the second one of the plurality of second wirings.

Optionally, each of the plurality of first wirings is formed to have a substantially the same total length.

Optionally, the step of forming the plurality of first wirings includes forming a portion of at least one of the plurality of first wirings in a zig-zag pattern. Optionally, the step of forming the plurality of first wirings includes forming a first one of the plurality of first wirings and a second one of the plurality of first wirings so that the linear distance (between its intersection with a corresponding signal line and its intersection with a corresponding bonding pad) of the first one of the plurality of first wirings is less than that of the second one of the plurality of first wirings, and a first width of a first zig-zag pattern in the first one of the plurality of first wirings is greater than a second width of a second zig-zag pattern in the second one of the plurality of first wirings. Optionally, the step of forming the plurality of first wirings includes forming a first one of the plurality of first wirings and a second one of the plurality of first wirings so that the linear distance (between its intersection with a corresponding signal line and its intersection with a corresponding bonding pad) of the first one of the plurality of first wirings is less than that of the second one of the plurality of first wirings, and a first length of a first zig-zag pattern in the first one of the plurality of first wirings is greater than a second length of a second zig-zag pattern in the second one of the plurality of first wirings.

Optionally, the plurality of first wirings are formed on both sides of the plurality of second wirings in plan view of the display panel.

In another aspect, the present disclosure provides a display apparatus having a display panel described herein or fabricated by a method described herein. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention". "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel having a display area and a fan-out area, comprising:

a plurality of wirings in the fan-out area respectively connected to a plurality of signal lines in the display area, a respective one of the plurality of wirings in the fan-out area configured to transmit a signal to a respective one of a plurality of subpixels through a respective one of the plurality of signal lines in the display area; and a plurality of bonding pads respectively connected to the plurality of wirings, configured to bond the plurality of wirings with a driver integrated circuit;

wherein the plurality of wirings are grouped into a plurality of groups of wirings comprising a first group of a plurality of first wirings and a second group of a plurality of second wirings;

a respective first wiring of the plurality of first wirings has one terminal directly connected to a respective first signal line of the plurality of signal lines and another terminal directed connected to a respective first bonding pad of the plurality of bonding pads, the respective first wiring has a first linear distance between its intersection with the respective first signal line and its intersection with a respective first bonding pad in a first distance range;

a respective second wiring of the plurality of second wirings has one terminal directly connected to a respective second signal line of the plurality of signal lines and another terminal directed connected to a respective second bonding pad of the plurality of bonding pads, the respective second wiring has a second linear distance between its intersection with the respective second signal line and its intersection with a respective second bonding pad in a second distance range, the second distance range being less than the first distance range;

the plurality of first wirings are made of a first conductive material; and the plurality of second wirings are made of a second conductive material; the second conductive material having a resistivity greater than that of the first conductive material.

2. The display panel of claim 1, further comprising a plurality of thin film transistors respectively in the plurality of subpixels, a respective one of the plurality of thin film transistors comprising a gate electrode, a source electrode and a drain electrode;

wherein the display panel comprises:

a first conductive layer comprising the plurality of first wirings and a plurality of gate electrodes of the plurality of thin film transistors;

a second conductive layer comprising the plurality of second wirings, a plurality of source electrodes and a plurality of drain electrodes of the plurality of thin film transistors; and a gate insulating layer between the first conductive layer and the second conductive layer.

3. The display panel of claim 1, further comprising a plurality of thin film transistors respectively in the plurality of subpixels, a respective one of the plurality of thin film transistors comprising a gate electrode, a source electrode and a drain electrode;

wherein the display panel comprises:

a first conductive layer comprising the plurality of first wirings a plurality of source electrodes and a plurality of drain electrodes of the plurality of thin film transistors;

a second conductive layer comprising the plurality of second wirings and a plurality of gate electrodes of the plurality of thin film transistors; and a gate insulating layer between the first conductive layer and the second conductive layer.

4. The display panel of claim 1, wherein a maximum value among electrical resistances of the plurality of wirings is greater than a minimum value among electrical resistances of the plurality of wirings by no more than 10%.

5. The display panel of claim 1, wherein each of the plurality of wirings has a substantially the same electrical resistance.

6. The display panel of claim 1, wherein the respective first wiring has a total electrical resistance substantially the same as a total electrical resistance of the respective second wiring.

7. The display panel of claim 1, wherein each of the plurality of second wirings has a substantially the same total length.

8. The display panel of claim 1, wherein a portion of at least one of the plurality of second wirings has a zig-zag pattern.

9. The display panel of claim 8, wherein the plurality of second wirings comprise a first respective second wiring and a second respective second wiring;

the first respective second wiring has a first respective linear distance between its intersection with a first respective second signal line of the plurality of signal lines and its intersection with a first respective second bonding pad of the plurality of bonding pads;

the second respective second wiring has a second respective linear distance between its intersection with a second respective second signal line of the plurality of signal lines and its intersection with a second respective second bonding pad of the plurality of bonding pads;

the first respective linear distance is less than the second respective linear distance; and a first width of a first zig-zag pattern in the first respective second wiring is greater than a second width of a second zig-zag pattern in the second respective second wiring.

10. The display panel of claim 8, wherein the plurality of second wirings comprise a first respective second wiring and a second respective second wiring;

the first respective second wiring has a first respective linear distance between its intersection with a first respective second signal line of the plurality of signal lines and its intersection with a first respective second bonding pad of the plurality of bonding pads;

the second respective second wiring has a second respective linear distance between its intersection with a second respective second signal line of the plurality of signal lines and its intersection with a second respective second bonding pad of the plurality of bonding pads;

the first respective linear distance is less than the second respective linear distance; and a first length of a first zig-zag pattern in the first respective second wiring is greater than a second length of a second zig-zag pattern in the second respective second wiring.

11. The display panel of claim 1, wherein each of the plurality of first wirings has a substantially the same total length.

12. The display panel of claim 1, wherein a portion of at least one of the plurality of first wirings has a zig-zag pattern.

13. The display panel of claim 12, wherein the plurality of first wirings comprise a first respective first wiring and a second respective first wiring;

the first respective first wiring has a first respective linear distance between its intersection with a first respective first signal line of the plurality of signal lines and its intersection with a first respective first bonding pad of the plurality of bonding pads;

the second respective first wiring has a second respective linear distance between its intersection with a second respective first signal line of the plurality of signal lines and its intersection with a second respective first bonding pad of the plurality of bonding pads;

the first respective linear distance is less than the second respective linear distance; and a first width of a first zig-zag pattern in the first respective first wiring is greater than a second width of a second zig-zag pattern in the second respective first wiring.

14. The display panel of claim 12, wherein the plurality of first wirings comprise a first respective first wiring and a second respective first wiring;

the first respective first wiring has a first respective linear distance between its intersection with a first respective first signal line of the plurality of signal lines and its intersection with a first respective first bonding pad of the plurality of bonding pads;

the second respective first wiring has a second respective linear distance between its intersection with a second respective first signal line of the plurality of signal lines and its intersection with a second respective first bonding pad of the plurality of bonding pads;

the first respective linear distance is less than the second respective linear distance; and a first length of a first zig-zag pattern in the first respective first wiring is greater than a second length of a second zig-zag pattern in the second respective first wiring.

15. The display panel of claim 1, wherein the plurality of first wirings are on both sides of the plurality of second wirings in plan view of the display panel.

16. The display panel of claim 1, wherein the second distance range is non-overlapping with the first distance range.

17. The display panel of claim 1, wherein the first linear distance for each of the plurality of second wirings is less than the second linear distance for each of the plurality of first wirings.

18. The display panel of claim 1, wherein the plurality of first wirings are made of copper and the plurality of second wirings are made of aluminum.

19. The display panel of claim 18, further comprising a plurality of thin film transistors respectively in the plurality of subpixels, a respective one of the plurality of thin film transistors comprising a gate electrode, a source electrode and a drain electrode;

wherein the gate electrode is made of copper; and the source electrode and the drain electrode is made of aluminum.

20. A display apparatus, comprising a display panel of claim 1.

* * * * *